United States Patent
Yang et al.

(12) 
(10) Patent No.: US 6,420,240 B1
(45) Date of Patent: Jul. 16, 2002

(54) METHOD FOR REDUCING THE STEP HEIGHT OF SHALLOW TRENCH ISOLATION STRUCTURES

(75) Inventors: Wenge Yang, Fremont; John Jianshi Wang, San Jose; Hao Fang, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/611,701

(22) Filed: Jul. 8, 2000

Related U.S. Application Data

(60) Provisional application No. 60/208,777, filed on Jun. 1, 2000.

(51) Int. Cl.[7] .............................................. H01L 21/76
(52) U.S. Cl. ........................................ 438/424; 438/734
(58) Field of Search ................... 438/425, 692, 438/734, 424

(56) References Cited

U.S. PATENT DOCUMENTS

| | | | |
|---|---|---|---|
| 5,120,671 A | | 6/1992 | Tang et al. .................... 437/43 |
| 5,130,268 A | * | 7/1992 | Liou et al. .................... 438/425 |
| 5,229,316 A | * | 7/1993 | Lee et al. ..................... 438/424 |
| 5,646,063 A | * | 7/1997 | Mehta et al. ................. 438/425 |
| 5,817,567 A | * | 10/1998 | Jang et al. .................... 438/427 |
| 5,854,121 A | * | 12/1998 | Gardner et al. .............. 438/425 |
| 6,060,348 A | * | 5/2000 | Yang et al. ................... 438/227 |
| 6,066,543 A | * | 5/2000 | Takahashi et al. ........... 438/424 |
| 6,238,997 B1 | * | 5/2001 | Chen et al. ................... 438/400 |
| 6,248,667 B1 | * | 6/2001 | Kim et al. .................... 438/690 |

OTHER PUBLICATIONS

Peters, Laura, Senior ed., "Choices and Challenges for Shallow Trench Isolation", *Semiconductors International*, Apr. 1999, pp. 68, 70, 72, 74, 76.

* cited by examiner

*Primary Examiner*—Matthew Smith
*Assistant Examiner*—Craig P. Lytle
(74) *Attorney, Agent, or Firm*—Skjerven Morrill LLP

(57) ABSTRACT

In one embodiment, a process for reducing the step height of shallow trench isolation structures includes the acts of (a) forming a hard mask on a semiconductor substrate to define a trench, (b) forming the trench, (c) filling the trench with a dielectric material, (d) planarizing the dielectric material,(e) replacing the hard mask with a resist mask, (f) etching back the dielectric material to reduce its step height, and (g) removing the resist mask. In another embodiment, the hard mask used to define the trench is used during the etch back of the dielectric material. In another embodiment, the hard mask used to define the trench is partially stripped before the dielectric material is planarized to reduce its step height.

10 Claims, 7 Drawing Sheets

METHOD FOR REDUCING THE STEP HEIGHT OF SHALLOW TRENCH ISOLATION STRUCTURES

CROSS-REFERENCE TO RELATED APPLICATIONS

This application claims the benefit of U.S. Provisional Application Ser. No. 60/208,777 filed Jun. 1, 2000,

BACKGROUND OF THE INVENTION

1. Field of the Invention

The present invention generally relates to semiconductor device fabrication and more particularly to processes for fabricating shallow trench isolation structures.

2. Description of the Related Art

Shallow trench isolation ("STI") is a well known semiconductor device fabrication process whereby features of a device are electrically isolated using relatively shallow trenches. STI has several advantages including higher device density by increasing the number of overlying levels on which features of the device are formed. FIGS. 1A–1F show cross-sectional views of a flash memory device being fabricated in accordance with a method in the prior art. As shown in FIG. 1A, hard masks 102 of silicon nitride are conventionally formed on a semiconductor substrate 101. Hard masks 102 define a shallow trench 103 that is subsequently formed in substrate 101. Shallow trench 103 is then filled with a dielectric 104 (FIG. 1B), which is TEOS in this example. Portions of dielectric 104 above hard masks 102 are planarized by chemical-mechanical planarization (FIG. 1C) and, thereafter, hard masks 102 are stripped (i.e. removed) (FIG. 1D) using a conventional wet strip process.

Typically, there will be portions of dielectric 104 that are left extending above trench 103 upon removal of hard masks 102. The height of this extended portion is referred to as step height and is depicted in FIG. 1D as step height 105. The step height results in topography (i.e. uneven surface) that is propagated to overlying layers. In FIG. 1E, conductive lines 106 (e.g., bit lines made of polysilicon), oxide-nitride-oxide ("ONO") layer 107, conductive layer 108 (e.g., polysilicon), and metal layer 109 (e.g., tungsten silicide) follow the topography caused by the step height. As shown in FIG. 1F, a magnified view of area 120 shown in FIG. 1E, sections 121–123 of conductive lines 106 have varying thicknesses because of the step height. Section 121 can be thicker than sections 122 or 123 by as much as 2000 Å in some instances. Thickness variation is also present in other layers overlying dielectric 104. If the thickness variation is large enough, the reliability and functionality of the device being fabricated will be adversely affected. For example, thickness variations can result in incomplete (or excessive) etching of conductive layer 108 and metal layer 109 during the formation of word lines, thereby causing shorts (also known as "stringers") between word lines.

From the foregoing, a method for reducing the step height of STI structures is highly desirable.

SUMMARY OF THE INVENTION

The present invention relates to a method for reducing the step height of STI structures.

In accordance with the invention, a method for reducing the step height of a shallow trench isolation structure includes the acts of: (a) forming a trench in a semiconductor substrate; (b) filling the trench with a dielectric material; (c) planarizing the dielectric material a first time; (d) planarizing the dielectric material a second time; and (e) forming overlying layers on the dielectric material.

In one embodiment, a hard mask is formed on a semiconductor substrate to define a subsequently formed trench. The trench is filled with a dielectric material, which is then planarized. The hard mask is stripped and replaced with a resist mask. The dielectric material is then etched back, thereby reducing its step height. The resist mask is stripped and, thereafter, overlying layers are formed on the dielectric material. In another embodiment, the hard mask used to define the trench is used in the etch back of the dielectric material instead of a resist mask.

In another embodiment, a hard mask is formed on a semiconductor substrate to define a subsequently formed trench. The trench is filled with a dielectric material, which is then planarized by chemical-mechanical planarization. A portion of the hard mask is then stripped. The dielectric material is planarized again by chemical-mechanical planarization, thereby reducing its step height. The hard mask is completely stripped and, thereafter, overlying layers are formed on the dielectric material.

BRIEF DESCRIPTION OF THE DRAWINGS

The use of the same reference symbol in different figures indicates the same or like elements.

DETAILED DESCRIPTION

The present invention relates to a method for reducing the step height of an STI structure. The inventors of the present invention have also disclosed a related method in commonly owned U.S. Patent Application, "Method For Reducing The Topography Of Shallow Trench Isolation Structures," attorney docket no. M-7965, incorporated herein by reference in its entirety. Throughout this disclosure, fabrication steps that are well known and not necessary to the understanding of the invention are omitted in the interest of clarity.

Figure 1A:
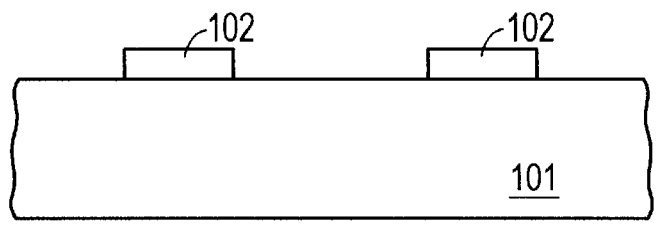
FIGS. 1A–1F show cross sectional views of a flash memory device being fabricated in accordance with a method in the prior art.
Figure 1B:
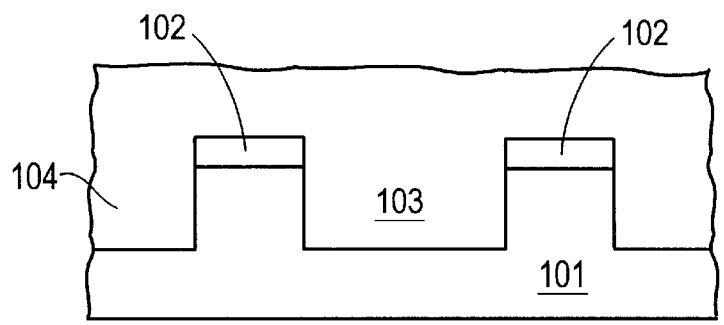
Figure 1C:
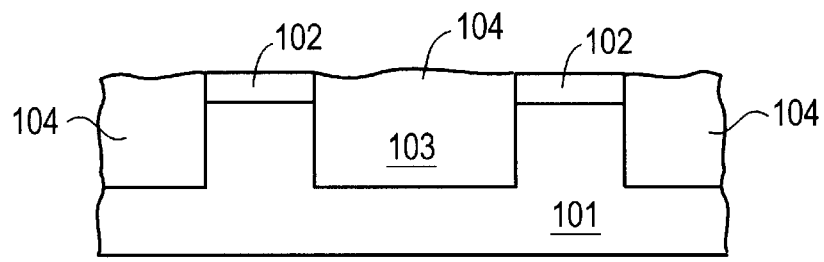
Figure 1D:
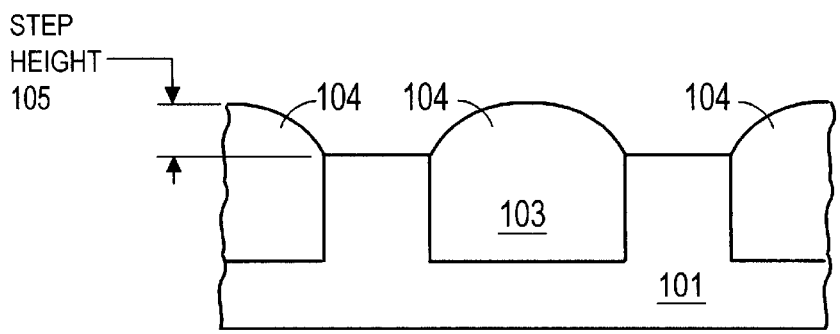
Figure 1E:
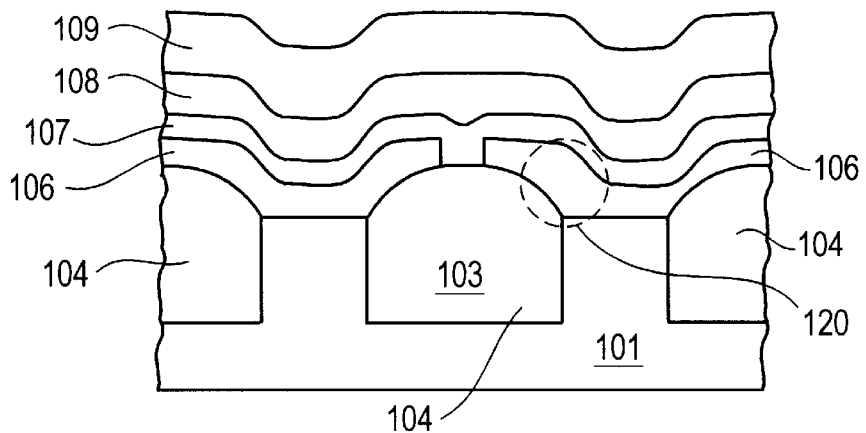
Figure 1F:
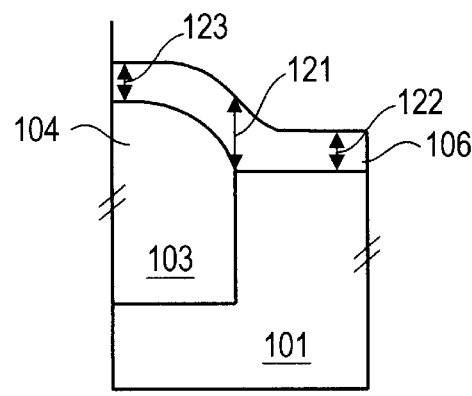
Figure 2A:
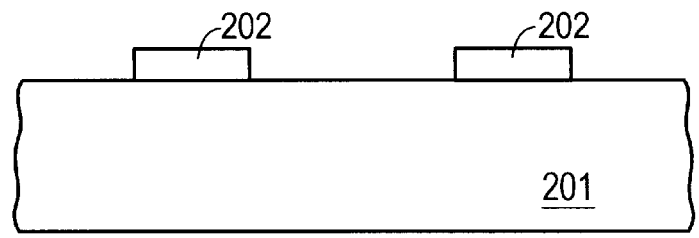
FIGS. 2A–2H show cross sectional views of a flash memory device being fabricated in accordance with a method in one embodiment of the invention.
Figure 2B:
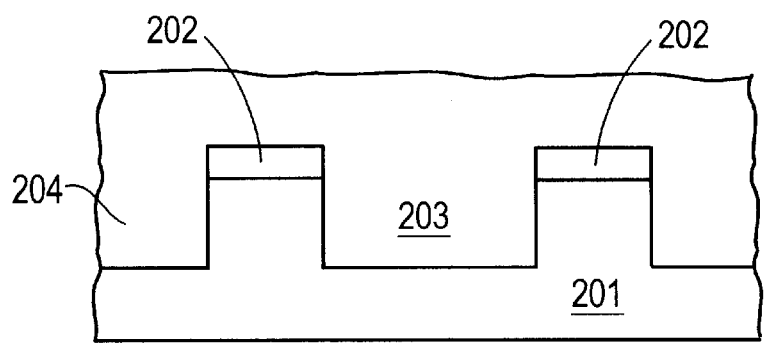
Figure 2C:
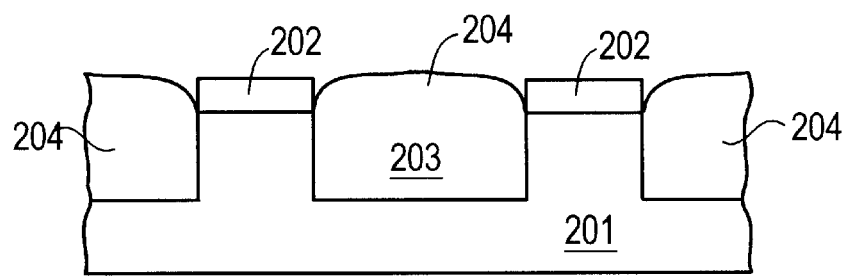
Figure 2D:
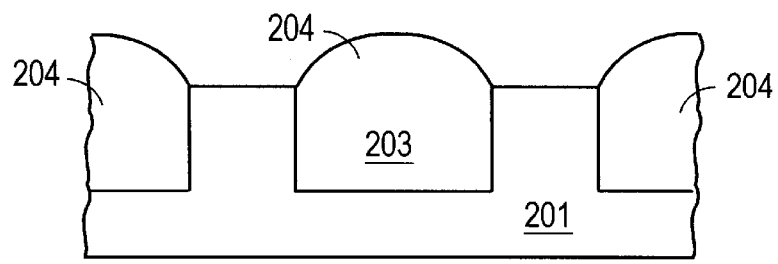
Figure 2E:
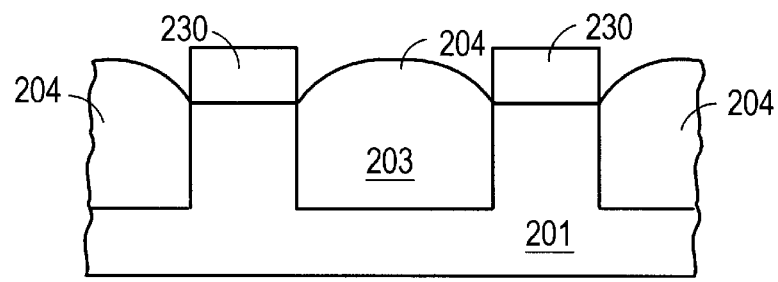

FIGS. 2A–2H show cross-sectional views of a flash memory device being fabricated in accordance with a method in one embodiment of the invention. While the fabrication of a flash memory device is described herein as an example, the invention is not so limited and may be used in the fabrication of other semiconductor devices. Referring to FIG. 2A, hard masks 202, which is of silicon nitride in this example, are conventionally formed on a semiconductor substrate 201. Hard masks 202 define the etching of substrate 201 to form a shallow trench 203, which is filled with a dielectric 204 such as TEOS (FIG. 2B). Dielectric 204 can be deposited in shallow trench 203 using conventional deposition techniques including by chemical vapor deposition. Portions of dielectric 204 above hard masks 202 are planarized by chemical-mechanical planarization ("CMP"), resulting in the structure shown in FIG. 2C. Thereafter, hard masks 202 are stripped using a conventional wet strip process (FIG. 2D).

Figure 2F:
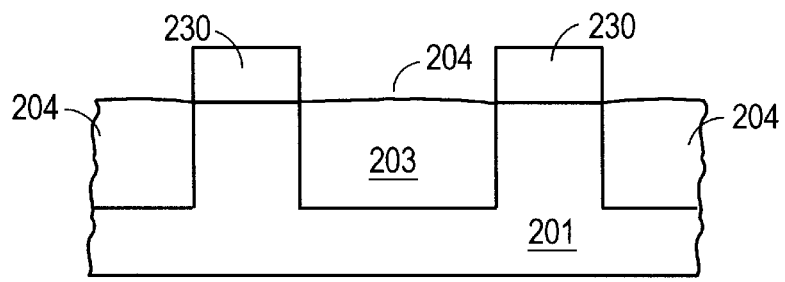
Figure 2G:
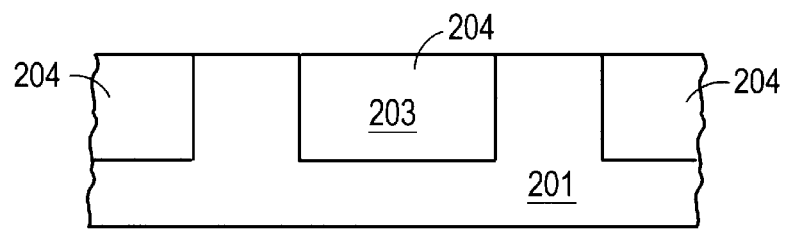
Figure 2H:
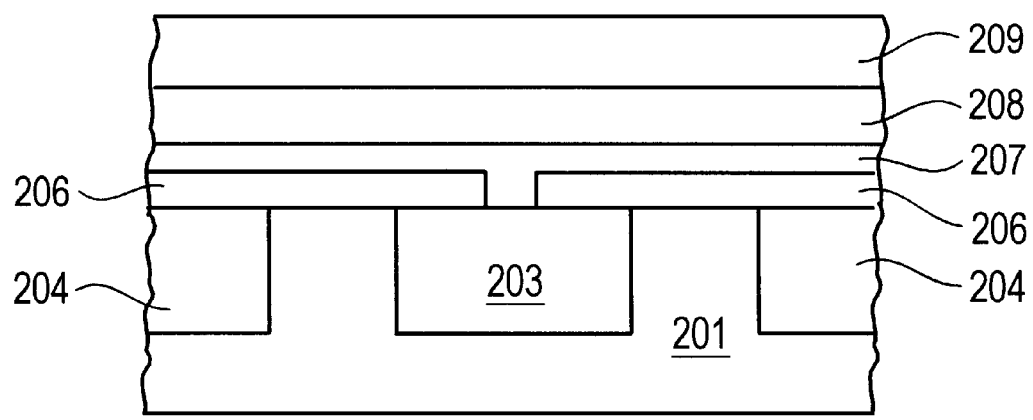

After hard masks 202 are stripped, resists 230 are formed on substrate 201 (FIG. 2E) using the same reticle (i.e. masking element) used to form hard masks 202 on substrate 201. Resists 230 can be any conventional resist used in the semiconductor industry. Dielectric 204 is then etched back using a conventional etch back process to reduce its step height (FIG. 2F). Resists 230 are stripped (FIG. 2G) after the etch back of dielectric 204 and, thereafter, conductive lines 206 (e.g., bit lines made of polysilicon), ONO layer 207, conductive layer 208 (e.g., polysilicon), and metal layer 209 (e.g., tungsten silicide) are conventionally formed overlying dielectric 204 as shown in FIG. 2H. As is well known, there is a thin layer of thermally grown oxide (not shown) between substrate 201 and bit lines 206.

Figure 3A:
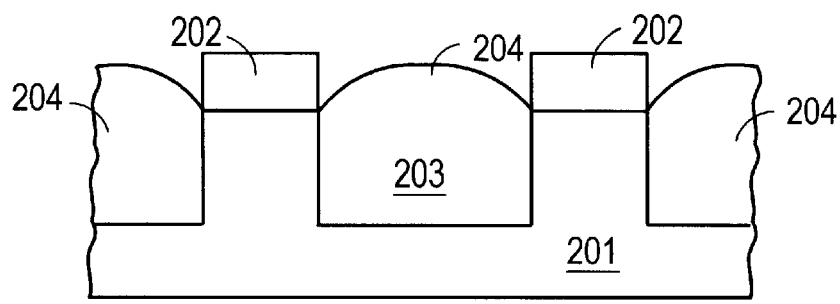
FIGS. 3A–3C show cross sectional views of a flash memory device being fabricated in accordance with a method in another embodiment of the invention.
Figure 3B:
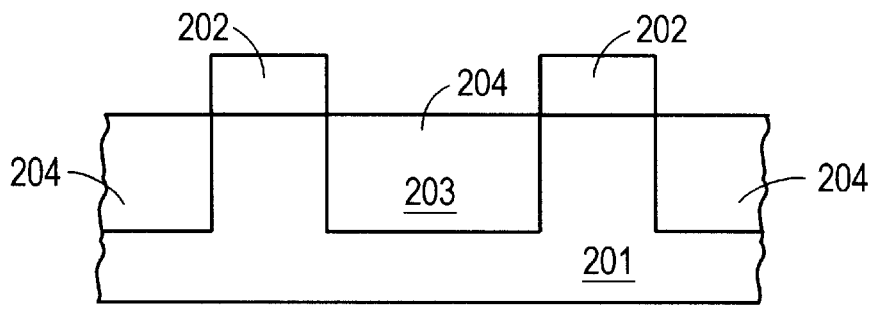
Figure 3C:
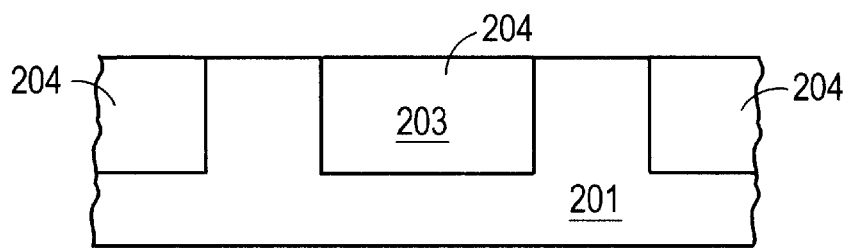

In another embodiment, the step height of an STI structure is reduced by using hard masks 202 in the etch back of dielectric 204. FIG. 3A shows a cross-sectional view of a flash memory device after the etching of substrate 201 to form shallow trench 203 and the subsequent planarization of the deposited dielectric 204 by CMP (see FIGS. 2A–2C and accompanying text). Using hard masks 202, dielectric 204 is etched back using a conventional etch back process to reduce its. step height (FIG. 3B). Hard masks 202 are stripped (FIG. 3C) after the etch back of dielectric 204 and, thereafter, overlying layers are formed on dielectric 204, resulting in the structure shown in FIG. 2H. In the etch back of dielectric 204, using hard masks 202 involves less processing steps as compared to using resists 230. Using resists 230, however, provides for a simpler etch back process because resists typically have higher selectivity than hard masks for a given material.

Figure 4A:
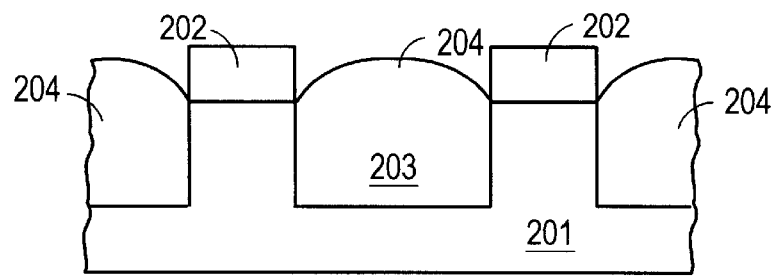
FIGS. 4A–4D show cross sectional views of a, flash memory device being fabricated in accordance with a method in another embodiment of the invention.
Figure 4B:
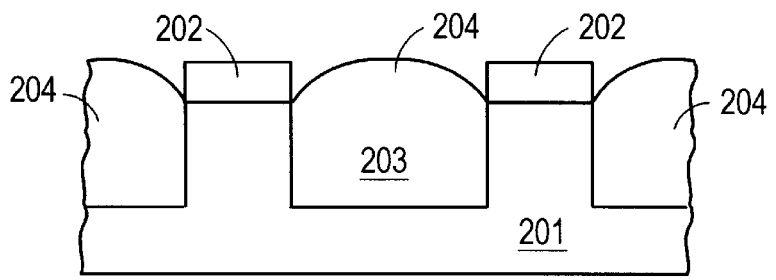
Figure 4C:
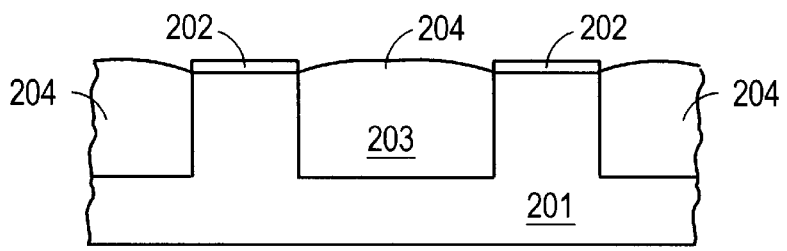
Figure 4D:
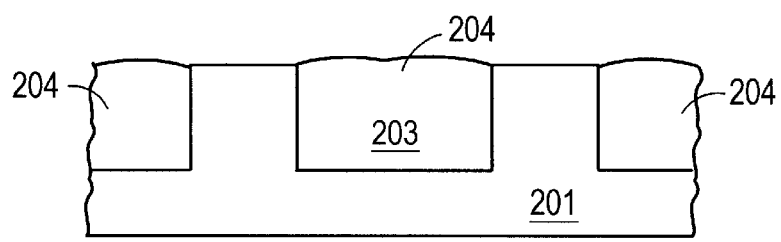

In another embodiment, the step height of an STI structure is reduced by partially stripping the masks used to define the shallow trench and then planarizing the resulting structure. FIG. 4A shows a cross-sectional view of a flash memory device after the etching of substrate 201 to form trench 203 and the subsequent planarization of the deposited dielectric 204 by CMP (see FIGS. 2A–2C and accompanying text). Thereafter, hard masks 202 are partially stripped (FIG. 4B). In one example, hard masks 202 are 1500 Å thick when first formed on substrate 201 and then partially stripped to a thickness of about 100 Å (i.e. 500 Å is removed). After hard masks 202 are partially stripped, dielectric 204 is planarized by CMP (FIG. 4C) thereby reducing its step height. Hard masks 202 are then completely stripped (FIG. 4D) and, thereafter, overlying layers are formed on dielectric 204, resulting in the structure shown in FIG. 2H.

While specific embodiments of this invention have been described, it is to be understood that these embodiments are illustrative and not limiting. For example, while a shallow trench isolation structure is disclosed herein, the invention is equally applicable to trench structures in general. Further, many additional embodiments that are within the broad principles of this invention will be apparent to persons skilled in the art.

What is claimed is:

1. A method for reducing the step height of a shallow trench isolation structure, said method comprising the acts of:
   (a) forming a mask on a substrate;
   (b) forming a trench in said substrate;
   (c) filling said trench with a dielectric material;
   (d) planarizing said dielectric material a first time to a level approximately coplanar with an upper surface of said mask;
   (e) planarizing said dielectric material a second time to a level approximately coplanar with an upper surface of said substrate; and
   (f) forming overlying layers on said dielectric material; wherein act (d) is by chemical mechanical planarization and act (e) is by an etch back process and further comprising the act of replacing a hard mask used to define said trench with a resist mask before performing act (e).

2. A method for fabricating a semiconductor device comprising in sequence the acts
   providing a semiconductor substrate;
   forming a first mask on said substrate;
   forming a trench in said substrate;
   filling said trench with a dielectric material;
   planarizing said dielectric material to a level approximately coplanar with an upper surface of said first mask;
   stripping said first mask;
   forming a second mask on said substrate;
   etching back said dielectric material to a level approximately coplanar with an upper surface of said substrate; and
   stripping said second mask.

3. The method of claim 2 wherein said first mask comprises silicon nitride.

4. The method of claim 2 wherein said first mask comprises a hard mask and said second mask comprises a resist mask.

5. The method of claim 2 wherein said dielectric material comprises TEOS.

6. The method of claim 2 wherein the act of planarizing comprises chemical-mechanical planarization (CMP).

7. A method for fabricating a semiconductor device comprising in sequence the acts
   (a) providing a semiconductor substrate;
   (b) forming a mask on said substrate;
   (c) forming a trench in said substrate;
   (d) depositing a dielectric material in said trench;
   (e) planarizing said dielectric material a first time to a level approximately coplanar with an upper surface of said mask;
   (f) stripping a portion of said mask;
   (g) planarizing said dielectric material a second time to a level approximately coplanar with an upper surface of said substrate; and
   (h) stripping said mask.

8. The method of claim 7 wherein said mask comprises silicon nitride.

9. The method of claim 7 wherein act (e) and act (g) are by chemical-mechanical planarization (CMP).

10. The method of claim 7 wherein said dielectric material comprises TEOS.

* * * * *